US010319608B2

(12) United States Patent
Tan

(10) Patent No.: US 10,319,608 B2
(45) Date of Patent: Jun. 11, 2019

(54) PACKAGE STRUCTURE AND METHOD THEROF

(71) Applicant: Silergy Semiconductor Technology (Hangzhou) LTD, Hangzhou, ZheJiang Province (CN)

(72) Inventor: Xiaochun Tan, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 15/176,384

(22) Filed: Jun. 8, 2016

(65) Prior Publication Data

US 2016/0372432 A1 Dec. 22, 2016

(30) Foreign Application Priority Data

Jun. 16, 2015 (CN) .......................... 2015 1 0332646

(51) Int. Cl.
*H01L 21/56* (2006.01)
*H01L 23/00* (2006.01)
(Continued)

(52) U.S. Cl.
CPC .......... *H01L 21/56* (2013.01); *H01L 23/3121* (2013.01); *H01L 23/3677* (2013.01); *H01L 23/49827* (2013.01); *H01L 23/5389* (2013.01); *H01L 24/19* (2013.01); *H01L 24/20* (2013.01); *H01L 24/24* (2013.01); *H01L 24/82* (2013.01); *H01L 24/32* (2013.01); *H01L 24/73* (2013.01); *H01L 24/92* (2013.01); *H01L 2224/04105* (2013.01); *H01L 2224/24226* (2013.01); *H01L 2224/32225* (2013.01); *H01L 2224/73267* (2013.01); *H01L 2224/82031* (2013.01); *H01L 2224/82039* (2013.01); *H01L 2224/92244* (2013.01); *H01L 2924/19042* (2013.01); *H01L 2924/19043* (2013.01)

(58) Field of Classification Search
CPC ....... H01L 2224/02331; H01L 23/5226; H01L 23/49827
See application file for complete search history.

(56) References Cited

U.S. PATENT DOCUMENTS

2003/0102489 A1   6/2003   Nam
2004/0262774 A1   12/2004  Kang et al.
(Continued)

FOREIGN PATENT DOCUMENTS

CN   101241904 A   8/2008
CN   101615609 A   12/2009

*Primary Examiner* — Farun Lu
(74) *Attorney, Agent, or Firm* — Michael C. Stephens, Jr.

(57) ABSTRACT

A package structure can include: (i) a substrate having opposite first and second surfaces; (ii) a die having opposite active and back surfaces, where the die is arranged above the first surface of the substrate, the back surface of the die is adjacent to the first surface of the substrate; (iii) pads arranged on the active surface of the die; (iv) a first encapsulator configured to encapsulate the die; (v) an interconnection structure configured to electrically connect to the pads through the first encapsulator; (vi) a second encapsulator configured to encapsulate the interconnection structure; and (vii) a redistribution structure configured to electrically connect to the interconnection structure and to provide external electrical connectivity.

19 Claims, 43 Drawing Sheets

(51) Int. Cl.
*H01L 23/31* (2006.01)
*H01L 23/367* (2006.01)
*H01L 23/498* (2006.01)
*H01L 23/538* (2006.01)

(56) References Cited

U.S. PATENT DOCUMENTS

| | | |
|---|---|---|
| 2005/0275061 A1 | 12/2005 | Ohguro |
| 2009/0039869 A1 | 2/2009 | Williams |
| 2010/0038778 A1* | 2/2010 | Lee .................. H01L 21/76898 257/737 |
| 2010/0072606 A1* | 3/2010 | Yang .................... H01L 23/481 257/692 |
| 2011/0134613 A1 | 6/2011 | Moussaoui |
| 2011/0298528 A1 | 12/2011 | Endo |
| 2012/0322202 A1 | 12/2012 | Nishimura |
| 2013/0180766 A1* | 7/2013 | Lee ..................... H05K 3/3463 174/255 |
| 2013/0299957 A1 | 11/2013 | Kobayashi et al. |
| 2015/0041982 A1* | 2/2015 | Hau-Riege ........ H01L 23/53266 257/753 |
| 2015/0061139 A1* | 3/2015 | Yap ........................ H01L 24/26 257/773 |
| 2016/0093571 A1* | 3/2016 | Kim ..................... H01L 21/486 257/774 |

* cited by examiner

PACKAGE STRUCTURE AND METHOD THEROF

RELATED APPLICATIONS

This application claims the benefit of Chinese Patent Application No. 201510332646.4, filed on Jun. 16, 2015, which is incorporated herein by reference in its entirety.

FIELD OF THE INVENTION

The present disclosure generally relates to the field of chip packaging, and more particularly to chip package assemblies and associated manufacturing methods.

BACKGROUND

Integrated circuit dice are typically packaged prior to being integrated with other electrical elements or devices in the manufacturing process. The package structure may at least provide sealing of dice, as well as provide electrical connectivity ports to external circuitry. For example, the package structure can provide electrical connectivity between dice and base board of electrical or electronic products, protection from pollution, mechanical support, heat dissipation, and also may reduce heat mechanical strain.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Connections between dice or integrated circuits and pins of a package structure is an essential part of achieving input and output connections between dice and external circuitry. In some cases, bonding wires can be used to achieve such connectivity. High purity thin metal wire (e.g., gold wire, copper wire, aluminum wire, etc.) can be employed to connect pads of dice to a leadframe or printed-circuit board (PCB). However, there may be drawbacks associated with the employment of bonding wires, such as pad cratering, tail inconformity, bending fatigue, vibration fatigue, breakage, and disconnection.

In one embodiment, a package structure can include: (i) a substrate having opposite first and second surfaces; (ii) a die having opposite active and back surfaces, where the die is arranged above the first surface of the substrate, the back surface of the die is adjacent to the first surface of the substrate; (iii) pads arranged on the active surface of the die; (iv) a first encapsulator configured to encapsulate the die; (v) an interconnection structure configured to electrically connect to the pads through the first encapsulator; (vi) a second encapsulator configured to encapsulate the interconnection structure; and (vii) a redistribution structure configured to electrically connect to the interconnection structure and to provide external electrical connectivity.

Figure 1:
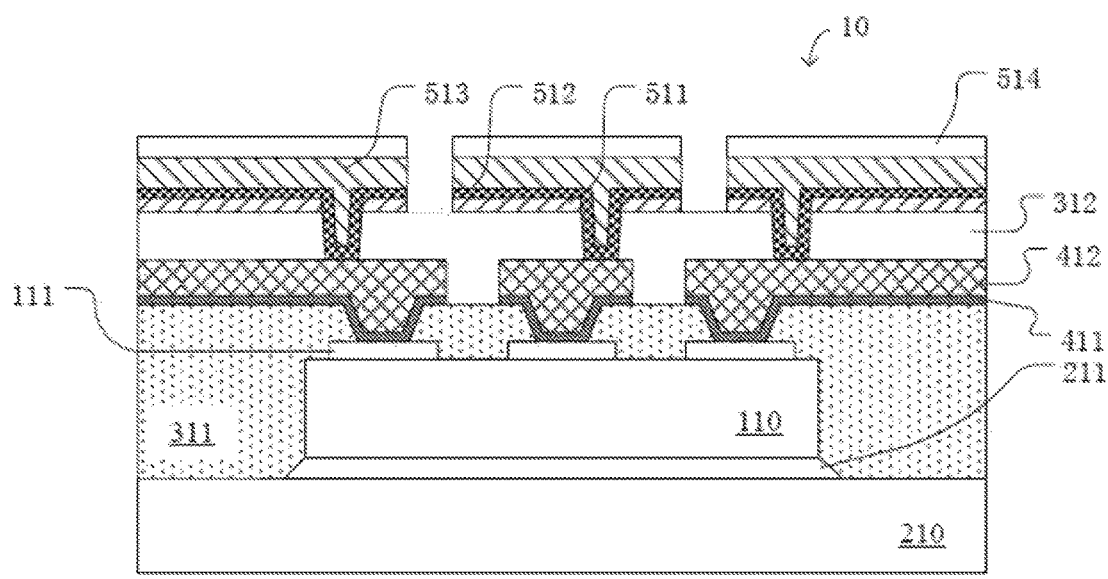
FIG. 1 is a cross-sectional view of a first example package structure, in accordance with embodiments of the present invention.

In particular embodiments, a package structure can utilize and interconnection and redistribution structure without bonding wires, in order to achieve electrical conductivity between pads and a leadframe or PCB board. Referring now to FIG. 1, shown is a cross-sectional view of a first example package structure, in accordance with embodiments of the present invention. In this particular example, package structure 10 can include package substrate 210, die 110, adhesive layer 211, encapsulators 311 and 312, an interconnection structure, and a redistribution structure. Package substrate 210 can include a semiconductor material (e.g., silicon, germanium, indium antimonide, gallium arsenide, indium arsenide, gallium nitride, etc.), an insulation material (e.g., epoxy resin, polyester glass, silicon oxide, PTEF, glass, ceramic, etc.), or a combination thereof.

Package substrate 210 can include opposite "first" and "second" surfaces. Die 110 can include opposite active and back surfaces. A device layer of die 110 may be adjacent to the active surface (e.g., including transistors, resistors, capacitors, inductors, etc.). Multiple metal layers can be arranged on the device layer, each of which can include a metal interconnection structure formed by copper and through holes surrounded by an insulating interlayer dielectric. Also, pads 111 can be arranged on the metal layers.

The back surface of die 110 can be bonded to a first surface of package substrate 210 through adhesive layer 211 (e.g., Au—Si alloy, Pb—Sn alloy, Sn—Ag—Cu alloy, conductive adhesive, etc.). For example, the conductive adhesive can be formed by adding a conductive adhesive that includes conductive particles or dispersants to epoxy resin. Encapsulator 311 can be formed on die 110 and the first surface of package substrate 210, and may encapsulate die 110 in order to protect it from damage or pollution. Encapsulator 311 can be formed by a different insulating material (e.g., ceramic, epoxy resin, etc.). Pads 111 may be exposed through corresponding openings of encapsulator 311.

The interconnection structure can include separate interconnection components. Each interconnection component includes metal layers 411 and 412 thereon. For example, metal layer 411 can be a seeding metal layer conformal to encapsulator 311. Metal layer 411 may be formed on a surface of encapsulator 311 and openings of encapsulator 311 by a deposition process. Also, metal layer 412 can be formed on metal layer 411 by an electroplating process. The interconnection components can achieve electrical connectivity between pads 111 and a corresponding redistribution structure that includes a first portion on encapsulator 311 and a second portion on the openings, in order to electrically connect to pads 111. Metal layers 411 and 412 can be formed by any suitable metal material (e.g. Ni, Al, Ti, W, Pt, Cu, Au, Co, Ta, TiN, TiW, etc.).

Encapsulator 312 can be formed on interconnection structures, in order to encapsulate and protect the interconnection structures from damaging and polluting. Encapsulator 312 can be formed by any suitable encapsulation material (e.g., ceramic, epoxy resin, etc.). Openings can be formed in encapsulator 312 in order to expose predetermined regions of the interconnection structures.

The redistribution structures can redistribute the electrodes of pads 111 including separate redistribution components. Each redistribution component can include a first portion extending along the surface of encapsulator 312, and a second portion on the openings of encapsulator 312, in order to electrically connect to corresponding interconnection components. The first portion of the redistribution component can include metal layers 511, 512, and 513, and weldable layer 514. As used herein, a "weldable" layer can be a metal type of layer on which solder balls or conductive bumps can be arranged for electrical connectivity. The second portion of the redistribution component can include metal layers 512 and 513, and weldable layer 514. Metal layer 511 can be deposited on encapsulator 312 outside of the openings in order to increase the thickness of the redistribution structure.

Metal layer 512 may be a seeding metal layer deposited on metal layer 511, and the openings of encapsulator 312 that are conformal to encapsulator 312 and electrically connected to the interconnection structure. For example, metal layer 513 can be formed on metal layer 512 by an electroplating process. Weldable layer 514 can be formed on metal layer 513. Metal layers 511, 512, and 513 can be formed by any suitable metal material (e.g., Ni, Al, Ti, W, Pt, Cu, Au, Co, Ta, TiN, TiW, etc.). Weldable layer 514 can be formed by any suitable weldable material (e.g., W, etc.) in order to electrically connect to a leadframe, PCB board, and/or other electrical elements.

In this way, the electrodes of pads of the die can be redistributed by the redistribution structure in order to increase the pin pitch of the package structure. Therefore, the size of the pins can be larger to improve the heat dissipation. Further, the package thickness and size of the package structure can be decreased in order to improve reliability by not utilizing bonding wires or conductive bumps.

Figure 2:
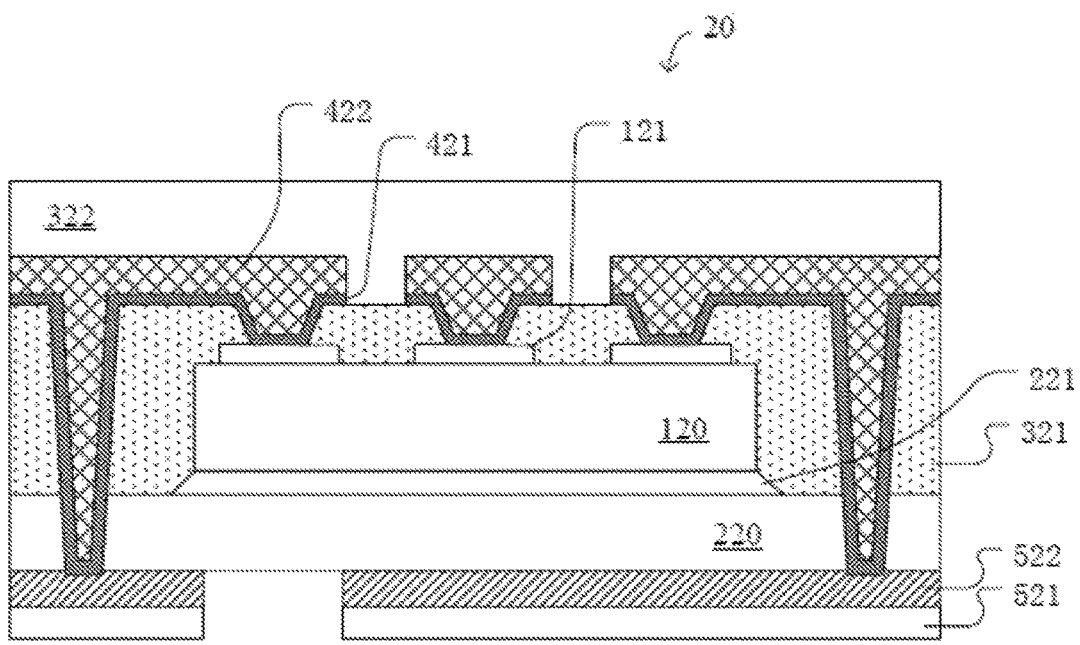
FIG. 2 is a cross-sectional view of a second example package structure, in accordance with embodiments of the present invention.

Referring now to FIG. 2, shown is a cross-sectional view of a second example package structure, in accordance with embodiments of the present invention. In this particular example, package structure 20 can include package substrate 220, die 120, adhesive layer 221, first encapsulator 321, interconnection structure, encapsulator 322, and the redistribution structure. For example, the interconnection structure can include patterned metal layers 421 and 422. Also, the redistribution structure can include metal layer 522 and weldable layer 521.

Package substrate 220 can include a semiconductor material (e.g., silicon, germanium, indium antimonide, gallium arsenide, indium arsenide, gallium nitride etc.), an insulation material (e.g., epoxy resin, polyester glass, silicon oxide, PTEF, glass, ceramic, etc.), or their combination. Package substrate 220 can include opposite first and second surfaces. Die 120 can include opposite active surface and back surface. The device layer of die 110 may be adjacent to the active surface (e.g., including transistors, resistors, capacitors, inductors, etc.). Multiple metal layers can be arranged on the device layer, each of which can include a metal interconnection structure formed by copper and through holes surrounded by an insulating interlayer dielectric. Pads 121 can be arranged on the metal layers.

The back surface of die 120 may be bonded to a first surface of package substrate 220 through adhesive layer 221 (e.g., Au—Si alloy, Pb—Sn alloy, Sn—Ag—Cu alloy, conductive adhesive, etc.). For example, the conductive adhesive can be formed by adding conductive adhesive including conductive particles or dispersants to epoxy resin. Encapsulator 321 can be formed on die 120 and the first surface of package substrate 220 and can encapsulate die 120 to protect it from damage or pollution. Encapsulator 321 can be formed by a different insulating material (e.g., ceramic, epoxy resin, etc.). Pads 121 may be exposed through corresponding openings of encapsulator 321.

The interconnection structure can include patterned metal layer 421 and metal layer 422 thereon. Metal layer 422 may be formed on metal layer 421. The combination structure of metal layers 421 and 422 can include separate interconnection components. The interconnection component can include a first portion on the surface of encapsulator 321, a second portion in the openings of encapsulator 321 electrically connected to pads 121, and a third portion electrically connected to the redistribution structure penetrating encapsulator 321 and package substrate 220. For example, metal layer 421 can be a seeding metal layer conformal to encapsulator 321 and formed by a deposition process, and metal layer 422 can be formed on metal layer 421 by an electroplating process.

Encapsulator 322 can be formed on the interconnection structure to seal and protect the interconnection structure to protect it from damage or pollution. Encapsulator 322 can be formed by any suitable material (e.g., ceramic, epoxy resin, etc.). The redistribution layer can be arranged on the second surface of package substrate 220 including patterned metal layer 522 and weldable layer 521. Metal layer 522 can be formed on the second surface of package substrate 220 and electrically connect to the third portion of the interconnection component. Weldable layer 521 may be formed on metal layer 522 by a weldable material, such as metal W, to electrically connect to a leadframe, PCB board, and/or other electrical elements.

In this way, the electrodes of pads of the die may be redistributed by the redistribution structure in order to increase the pin pitch of the package structure. Therefore, the size of the pins can be larger to improve heat dissipation. Also, the package thickness and size of the package structure can be decreased in order to improve reliability without the use of bonding wires and conductive bumps.

Figure 3:
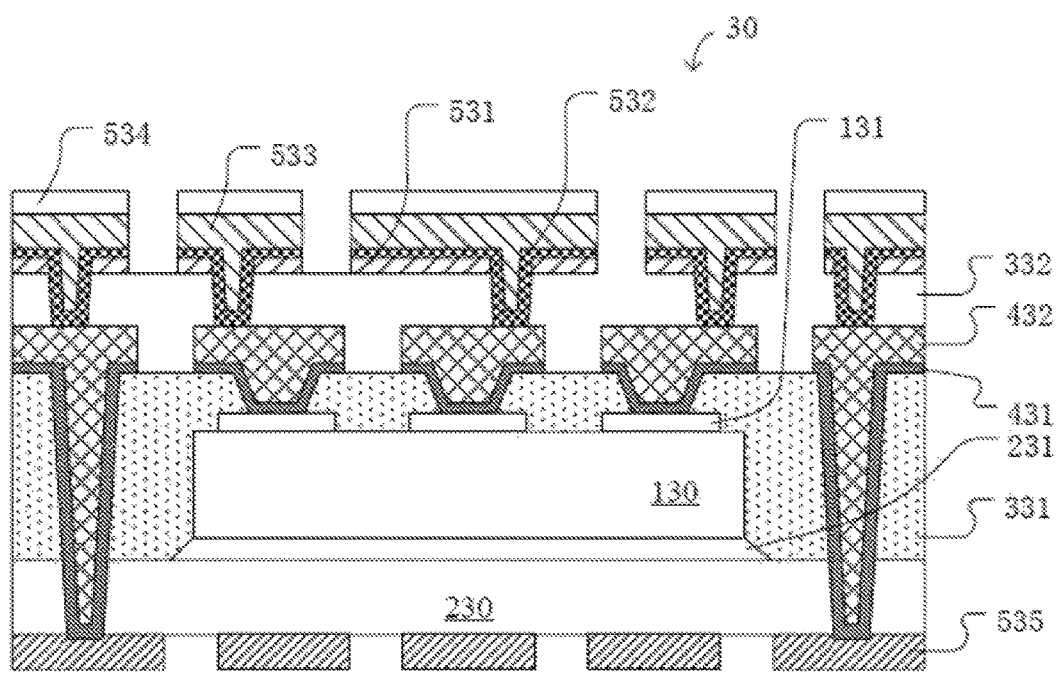
FIG. 3 is a cross-sectional view of a third example package structure, in accordance with embodiments of the present invention.

Referring now to FIG. 3, shown is a cross-sectional view of a third example package structure, in accordance with embodiments of the present invention. In this particular example, package structure 30 can include package substrate 230, die 130, adhesive layer 231, encapsulator 321, interconnection structure, encapsulator 332, a throughout channel structure, and a redistribution structure. For example, the interconnection structure can include patterned metal layers 431 and 432. Also, the redistribution structure can include patterned metal layers 531 and 532, and weldable layer 534.

Package substrate 230 can include semiconductor material (e.g., silicon, germanium, indium antimonide, gallium arsenide, indium arsenide, gallium nitride, etc.), an insulation material (e.g., epoxy resin, polyester glass, silicon oxide, PTEF, glass, ceramic, etc.), or their combination. Package substrate 230 can include opposite first and second surfaces. Back metal layer 535 may be formed on the second surface of package substrate 230 to electrically connect other chips, resistors, inductors, and/or other elements. For example, back metal layer 535 can be a sawtooth structure to improve the performance of heat dissipation.

Die 130 can include opposite active surface and back surface. The device layer of die 110 is adjacent to the active surface including transistors, resistors, capacitors, inductors and others. Multiple metal layers can be arranged on the device layer, each of which can include a metal interconnection structure formed by copper and through holes surrounded by an insulating interlayer dielectric. Pads 131 can be arranged on the metal layers. The back surface of die 130 may be bonded to the first surface of package substrate 230 though adhesive layer 231.

Encapsulator 331 can encapsulate die 130 and package substrate 230 in order to seal and protect die 130 from damage or pollution. Encapsulator 331 can be formed by many types of material, such as ceramic and epoxy resin. Openings can be formed in encapsulator 331 corresponding to pads 131 in order to expose pads 131. Thorough holes can be formed by penetrating encapsulator 331 and package substrate 230, in order to expose back metal layer 535.

The combined structure of patterned metal layers 431 and 432 can include separate interconnection components and separate first channel components of the throughout channel structure. The interconnection component can include a first portion extending along the surface of encapsulator 331, and a second portion in the opening electrically connected to pads 131. The first channel component can include a first portion extending along the surface of encapsulator 331, and a second portion in the third through holes electrically connected to back metal layer 535. Encapsulator 332 can encapsulate the interconnection structure and first channel components to seal and protect the interconnection structure and the first channel components.

Openings may be formed in encapsulator 332 to expose predetermined portions of the interconnection components and the first channel components. Metal layer 531 can be formed on the surface of encapsulator 332 outside of the openings by a deposition process in order to increase the thickness of the redistribution structure. Metal layer 532 can be a seeding metal layer formed on metal layer 531 and the openings of encapsulator 332 by a deposition process in order to electrically connect to predetermined regions of interconnection components. Metal layer 533 can be formed on metal layer 532 by an electroplating process. Welding layer 534 may be formed on metal layer 533 to electrically connect to a leadframe, PCB board, and/or other elements.

The combination structure of stacked metal layers 531, 532, and 533, and weldable layer 534 can include separate redistribution components and separate second channel components. The redistribution component can include a first portion extending along the surface of encapsulator 332, and a second portion in the opening to electrically connect to interconnection components. The second channel component can include a first portion extending along the surface of encapsulator 332, and a second portion in the third openings of encapsulator 332 to electrically connect to the second portion of first channel component.

In this way, the electrodes of pads of the die can be redistributed by the redistribution structure to increase the pin pitch of the package structure. Therefore, the size of the pins can be larger to improve heat dissipation. Also, the package thickness and size of the package structure can be decreased to improve reliability without use of bonding wires or conductive bumps.

Figure 4:
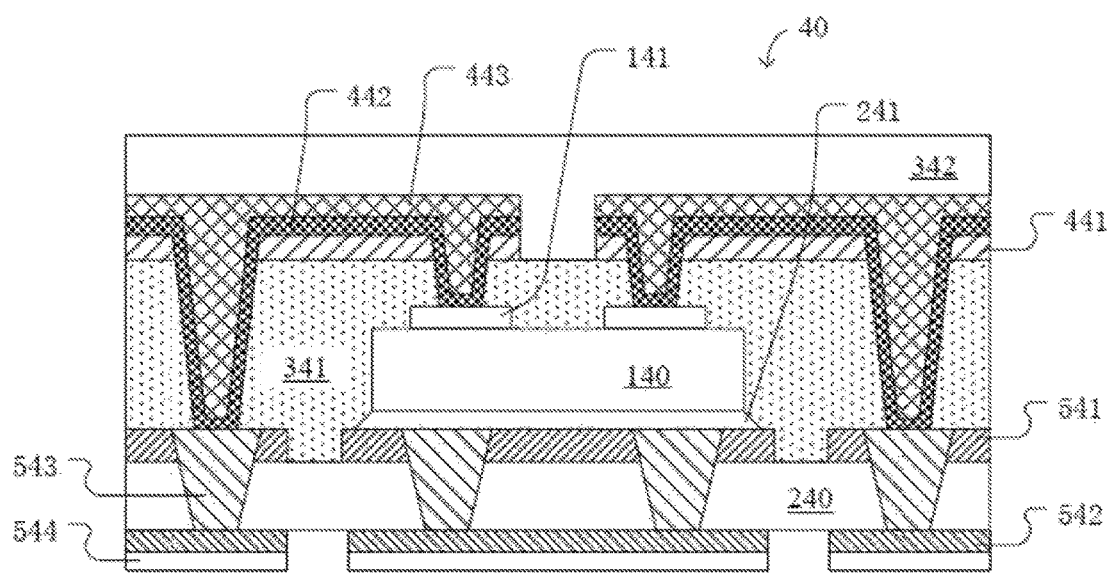
FIG. 4 is a cross-sectional view of a fourth example package structure, in accordance with embodiments of the present invention.

Referring now to FIG. 4, shown is a cross-sectional view of a fourth example package structure, in accordance with embodiments of the present invention. In this particular example, package structure 40 can include package substrate 240, die 140, adhesive layer 241, metal layer 541, conductive channel component 543, encapsulator 341, interconnection structure, second encapsulator 342, and redistribution structure. For example, the interconnection structure can include patterned metal layers 441, 442, and 443. Also, the redistribution structure can include patterned metal layer 542 and weldable layer 544.

Package substrate 240 can include a semiconductor material (e.g., silicon, germanium, indium antimonide, gallium arsenide, indium arsenide, gallium nitride, etc.), an insulation material (e.g., epoxy resin, polyester glass, silicon oxide, PTEF, glass, ceramic, etc.), or their combination. Package substrate 240 can include opposite first surface and second surface. Through holes can be formed in package substrate 240. Patterned metal layer 541 can be formed on the first surface of package substrate 240 including separate components.

The redistribution structure can include patterned metal layer 542 and weldable layer 544. Metal layer 542 may be formed on the second surface of package substrate 240, and weldable layer 544 can be formed on metal layer 542. Metal layer 542 can be formed by any suitable materials (e.g., Ni, Al, Ti, W, Pt, Cu, Co, Ta, TiN, TiW, etc.). Weldable layer 544 can include any suitable weldable materials (e.g., W), in order to electrically connect to a leadframe, PCB board, and/or other electrical elements.

Conductive channel component 543 may be formed by filling the through holes of package substrate 240. Die 140 can include opposite active and back surfaces. Pads 141 can be arranged on the active surface of die 140. Also, pads 141 may be arranged on the back surface of die 140. The back surface of die 140 can be bonded to at least one region of metal layer 541 through adhesive layer 241 (e.g., AuSi, PbSn, epoxy resin, etc.). Pads 141 on the back surface of die 140 can be electrically connected to corresponding conductive channel components 543.

Encapsulator 341 can encapsulate die 140 and metal layer 541 in order to protect die 140 and metal layer 541 from damage or pollution. Encapsulator 341 can be formed by any suitable types of materials, such as ceramic and/or epoxy. Openings can be formed in encapsulator 341, where some openings may expose pads 141, and some openings can expose corresponding conductive channel components 543 or metal layer 541.

The interconnection structure can include patterned metal layers 441, 442, and 443. Metal layer 441 may be formed on the surface of encapsulator 341 outside of the regions of first and second openings, in order to increase the thickness of the interconnection structure. Metal layer 442 can be arranged on metal layer 441 and in the openings and through holes. Metal layer 442 can be a seeding metal layer that is conformal to encapsulator 341. Metal layer 443 can be arranged on metal layer 442. Metal layer 442 can include a first portion extending along the surface of encapsulator 331, a second portion in the openings electrically connected to pads 131, and a portion in the openings electrically connected to conductive channel component 543.

Encapsulator 342 can be formed on the interconnection structure in order to seal and protect the interconnection structure from damage or pollution. Pads 141 on the active surface of die 140 can be electrically connected to the redistribution structure through the interconnection structure and conductive channel component 543. Pads 141 on the back surface of die 140 can be electrically connected to the redistribution layer through conductive channel component 543. Therefore, the electrodes of pads 141 on the active and back surfaces of die 140 may be redistributed. In this example, pads 141 of die 140 can be redistributed by the redistribution structure in order to increase the pin pitch of the package structure, so the size of the pins can be larger. Also, the thickness and size of the package structure can be decreased in order to improve the reliability.

In one embodiment, a method of making a package structure, can include: (i) providing a substrate; (ii) arranging a die on a first surface of the substrate, where the die comprises opposite active and back surfaces, the back surface being adjacent to the first surface; (iii) arranging pads on the active surface; (iv) forming a first encapsulator to encapsulate the die; (v) forming an interconnection structure that is electrically connected to the pads through the first encapsulator; (vi) forming a second encapsulator to encapsulate the interconnection structure; and (vii) forming a redistribution structure that is electrically connected to the interconnection structure.

Figure 5A:
FIGS. 5A-5J are cross-sectional views of an example method of making the first example package structure, in accordance with embodiments of the present invention.

Referring now to FIGS. 5A-5J, shown are cross-sectional views of an example method of making the first example package structure, in accordance with embodiments of the present invention. In FIG. 5A, package substrate 210 can be provided. Package substrate 210 can include a semiconductor material (e.g., silicon, germanium, indium antimonide, ium arsenide, indium arsenide, gallium nitride, etc.), an insulation material (e.g., epoxy resin, polyester glass, silicon oxide, PTEF, glass, ceramic, etc.), or their combination. Package substrate 210 can include opposite first and second surfaces.

Figure 5B:
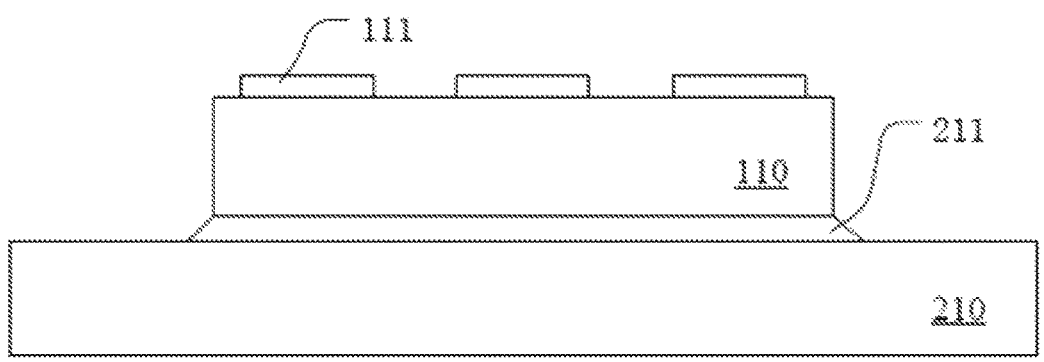
Figure 5C:
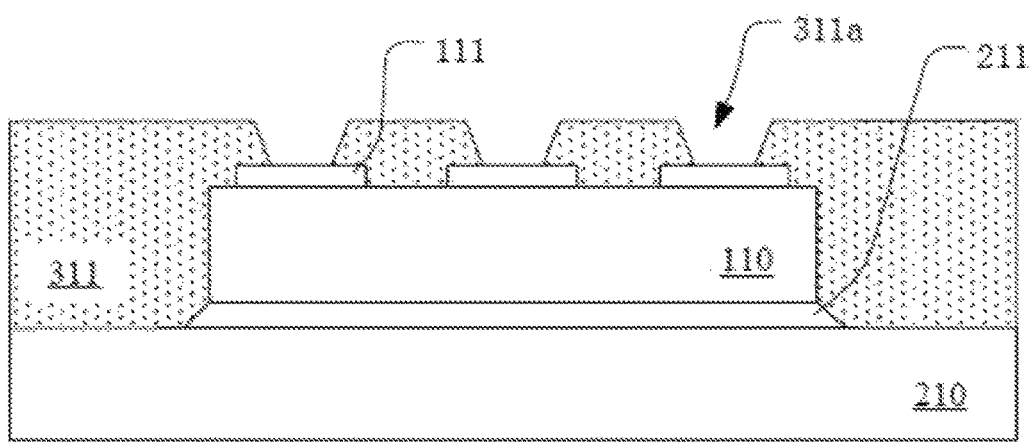

In FIG. 5B, die 110 can be bonded to a first surface of package substrate 210 through adhesive layer 211. Die 110 can include opposite active and back surfaces. The active surface can be arranged upward, and pads 111 may be arranged thereon. Adhesive layer 211 can be arranged between the back surface of die 110 and the first surface of package substrate 210 (e.g., formed by alloy Au—Si, Pb—Sn, Sn—Ag—Cu, conductive resin, etc.). In FIG. 5C, encapsulator 311 can be formed with openings to expose pads 111 to encapsulate and protect die 110. For example, encapsulator 311 can be formed by plastic encapsulation or a "prepreg" process (e.g., obtained by impregnating a sheet-shaped base member with thermosetting resin). Also for example, the first openings can be formed by chemical etching, laser etching or the combination of the above two processes.

Figure 5D:
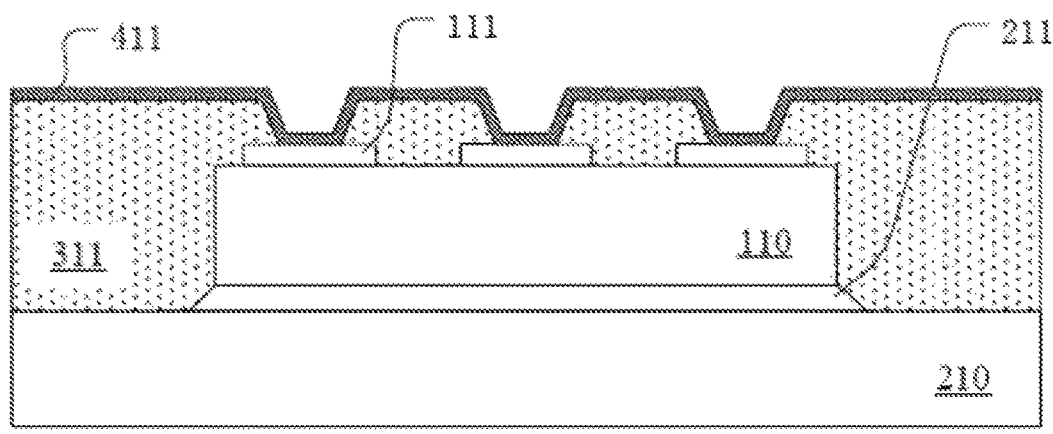

In FIG. 5D, by a deposition process, metal layer 411 can be deposited on the surface of encapsulator 311 and the openings, and metal layer 411 on the surface of encapsulator 311 can be flattened by a chemical mechanical polishing (CMP) process. Metal layer 411 may be conformal to the surface of encapsulator 311 and the openings. Also, such as prior to a deposition process, pads 111 may be cleaned by plasma.

Figure 5E:
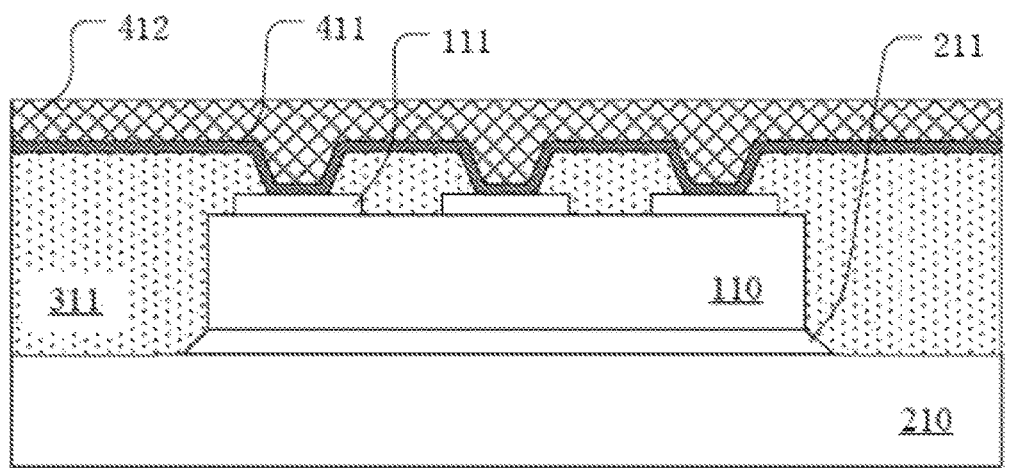
Figure 5F:
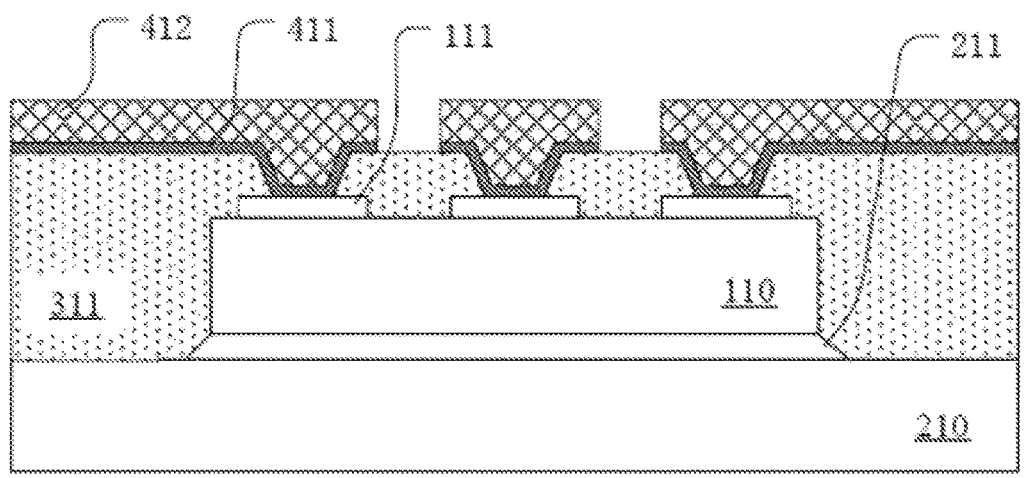

In FIG. 5E, metal layer 412 can be formed on metal layer 411 by electroplating process. Metal layer 412 can be thick enough to fill out first openings, and may be flattened by a CMP process. In FIG. 5F, patterned metal layers 411 and 412 can form the interconnection structure. The patterning step can include forming photoresist (PR) on metal layer 412. Then, patterned photoresist can be formed by exposing and developing the photoresist then, etching metal layers 411 and 412 can be uncovered by the photoresist in order to expose the surface of encapsulator 311. Finally, the remaining photoresist can be removed.

Figure 5G:
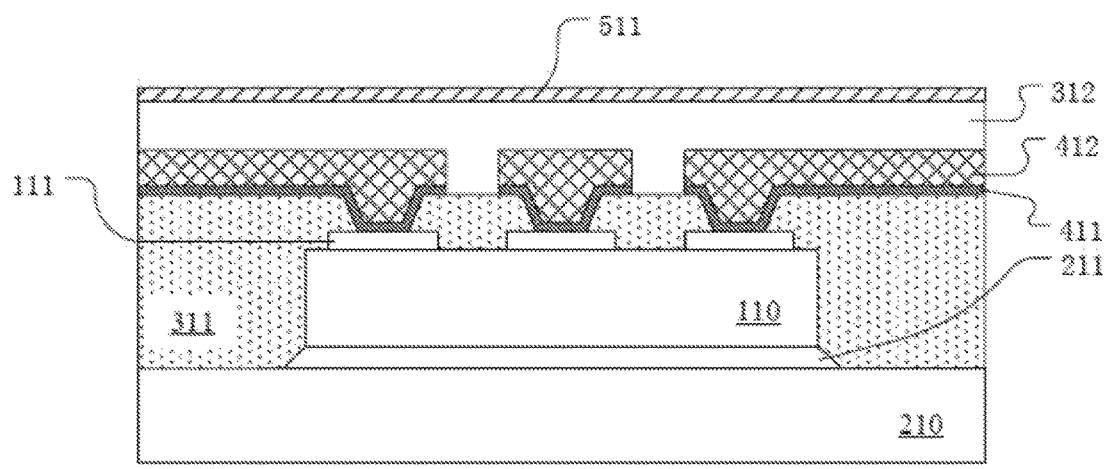
Figure 5H:
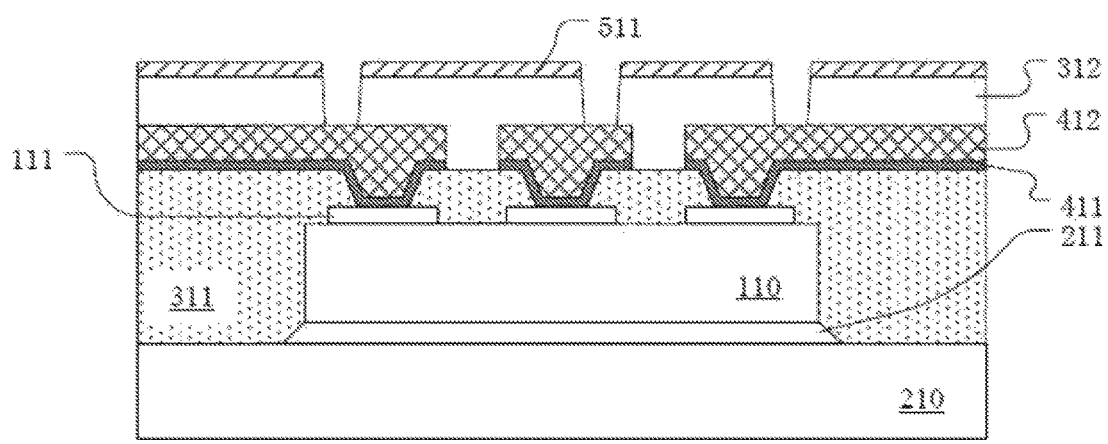

In FIG. 5G, encapsulator 312 may be formed and metal layer 511 can be deposited thereon. Encapsulator 312 can be formed by a plastic encapsulation or a prepreg process, for example. In FIG. 5H, openings can be formed in encapsulator 312 and metal layer 511 to expose the interconnection structure. The forming of such openings can include forming a photoresist layer on metal layer 511. Then, a patterned photoresist layer can be formed by exposing and developing to expose metal layer 511 corresponding to the openings. Then, metal layer 511 and encapsulator 312 uncovered by the photoresist layer can be etched (e.g., through chemical etching process, laser etching process, etc.) to form the openings to expose the interconnection structure. Finally, the remaining photoresist layer can be removed.

Figure 5I:
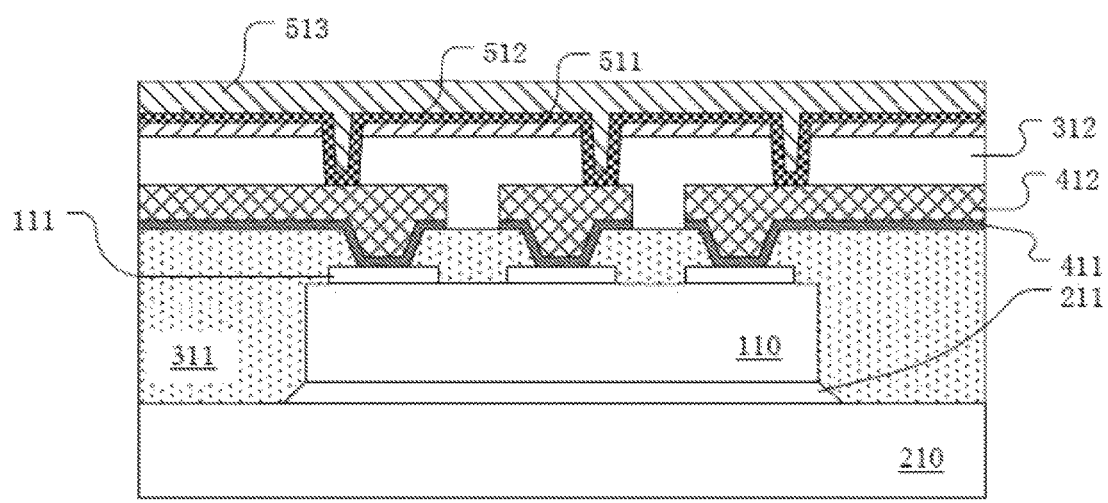
Figure 5J:
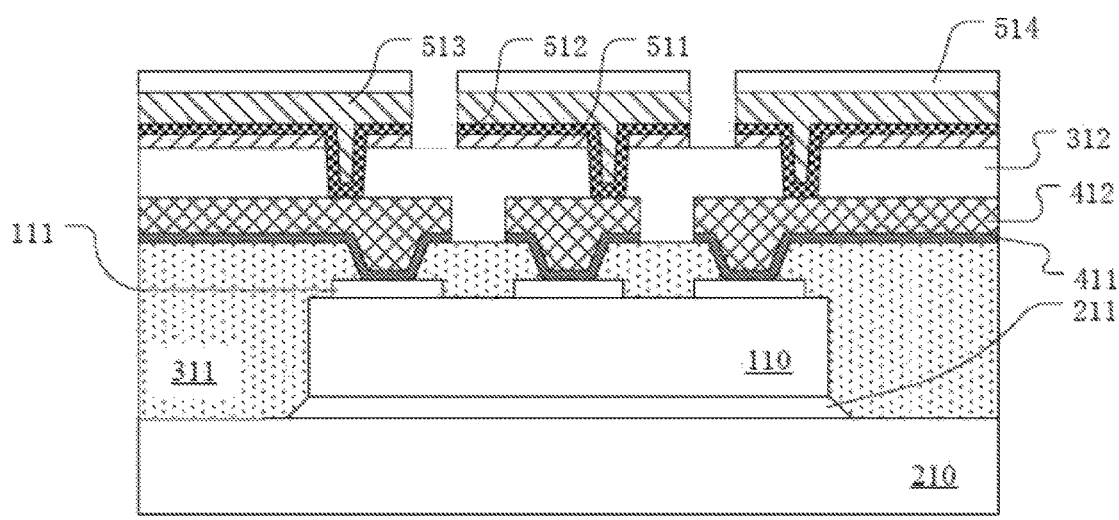

In FIG. 5I, metal layer 512 can be deposited on metal layer 511 and the openings. Also, metal layer 513 may be formed on metal layer 512 by an electroplating process, and then weldable layer 514 can be formed on metal layer 513. In FIG. 5J, metal layers 511, 512, and 513, and weldable layer 514 may be patterned in order to form the redistribution structure.

Figure 6A:
FIGS. 6A-6H are cross-sectional views of an example method of making the second example package structure, in accordance with embodiments of the present invention.

Referring now to FIGS. 6A-6H, shown are cross-sectional views of an example method of making the second example package structure, in accordance with embodiments of the present invention. In FIG. 6A, package substrate 220 can be provided, and metal layer 521 may be deposited on the second surface of package substrate 220. Package substrate 220 can include a semiconductor material (e.g., silicon, germanium, indium antimonide, gallium arsenide, indium arsenide, gallium nitride, etc.) an insulation material (e.g., epoxy resin, polyester glass, silicon oxide, PTEF, glass, ceramic, etc.), or their combination. Package substrate 220 can include opposite first and second surfaces.

Figure 6B:
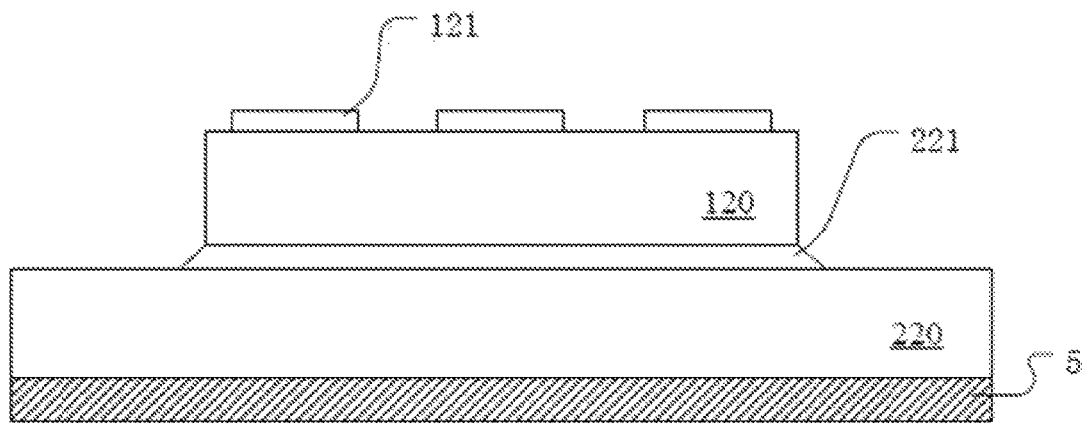
Figure 6C:
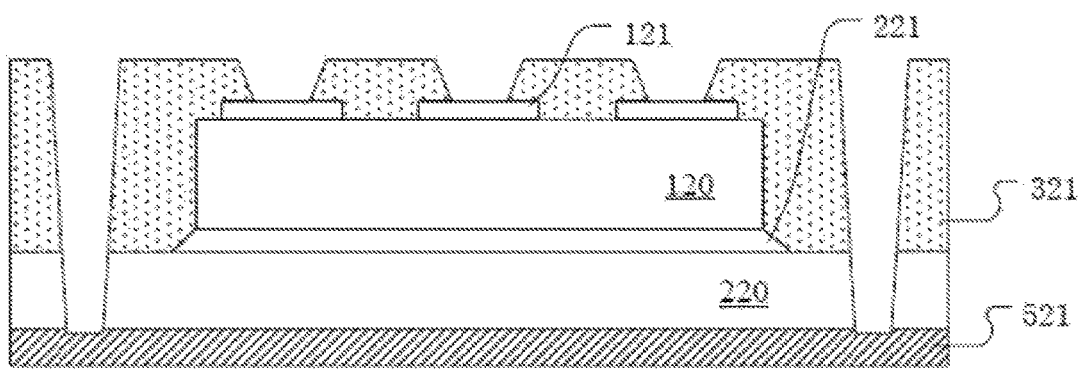

In FIG. 6B, die 120 can be bonded to first surface of package substrate 220 through adhesive layer 221. Die 120 can include opposite active surface and back surface. The active surface may be arranged upward, and pads 121 can be arranged thereon. Adhesive layer 221 may be arranged between the back surface of die 110 and the first surface of package substrate 220. In FIG. 6C, encapsulator 321 can be formed with openings to expose pads 111, and through holes may be formed by penetrating encapsulator 321 and package substrate 220 to expose metal layer 521. Encapsulator 321 can encapsulate and protect die 120. Encapsulator 311 can be formed by plastic encapsulation or prepreg process, for example. The first openings and second through holes can be formed by chemical etching, laser etching processes, or other suitable processes.

Figure 6D:
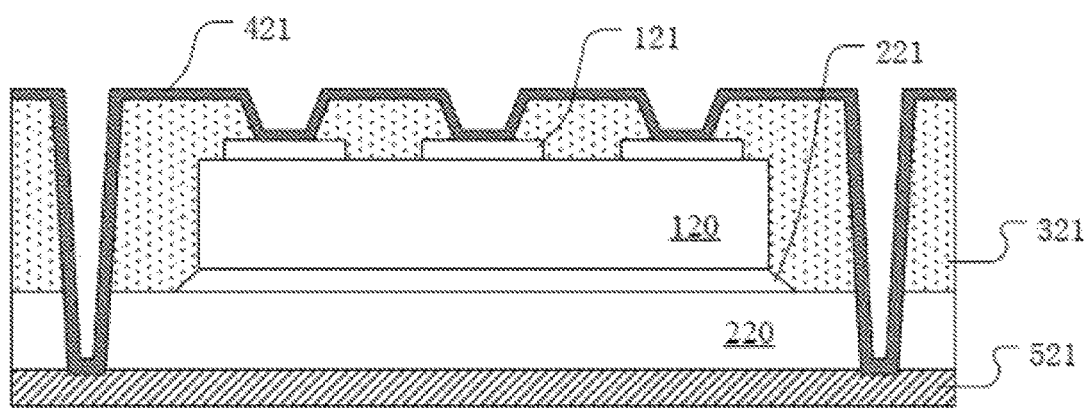
Figure 6E:
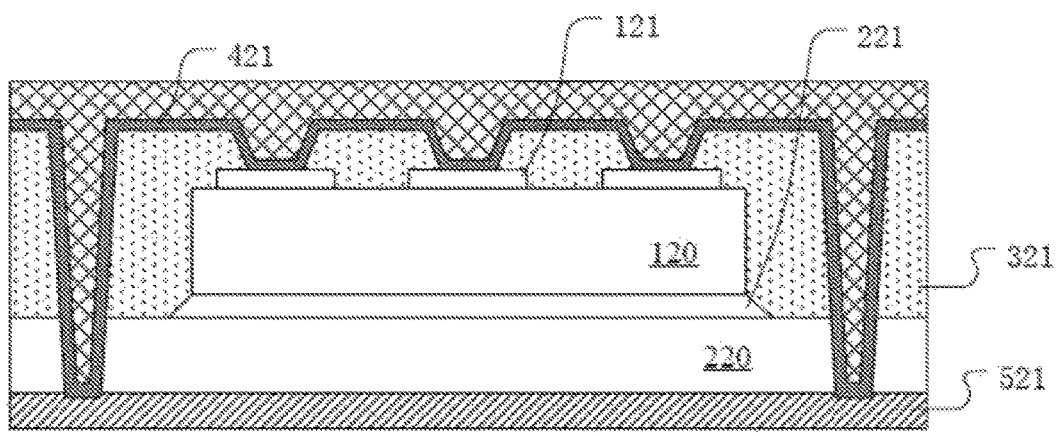
Figure 6F:
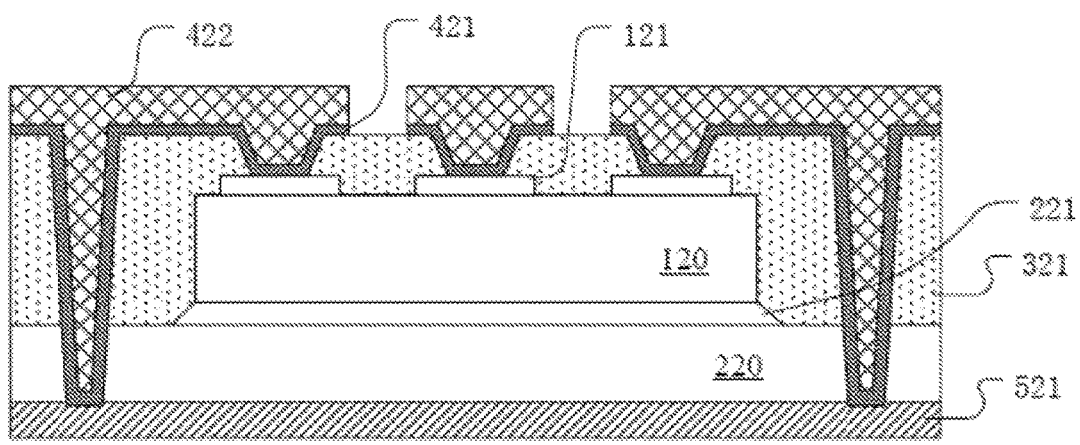
Figure 6G:
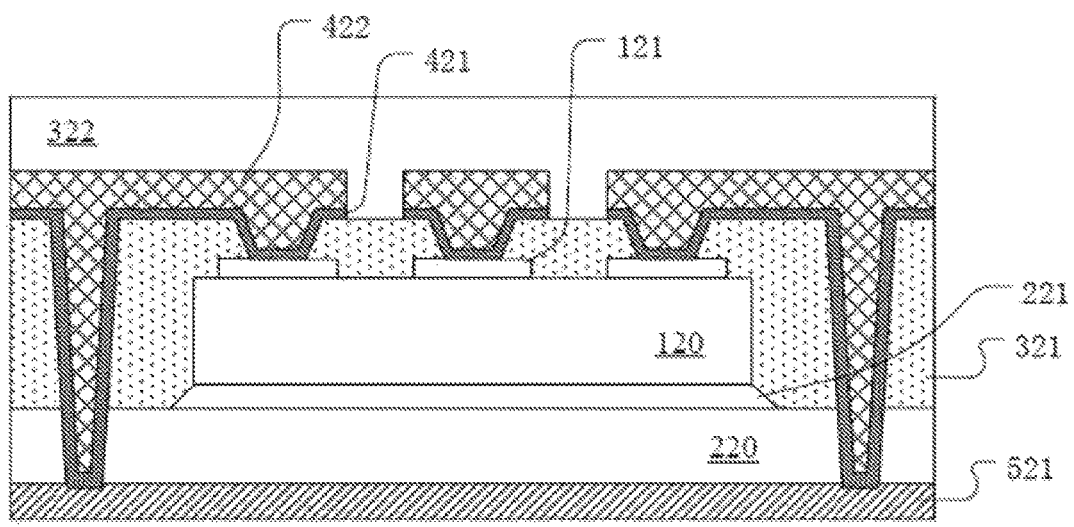
Figure 6H:
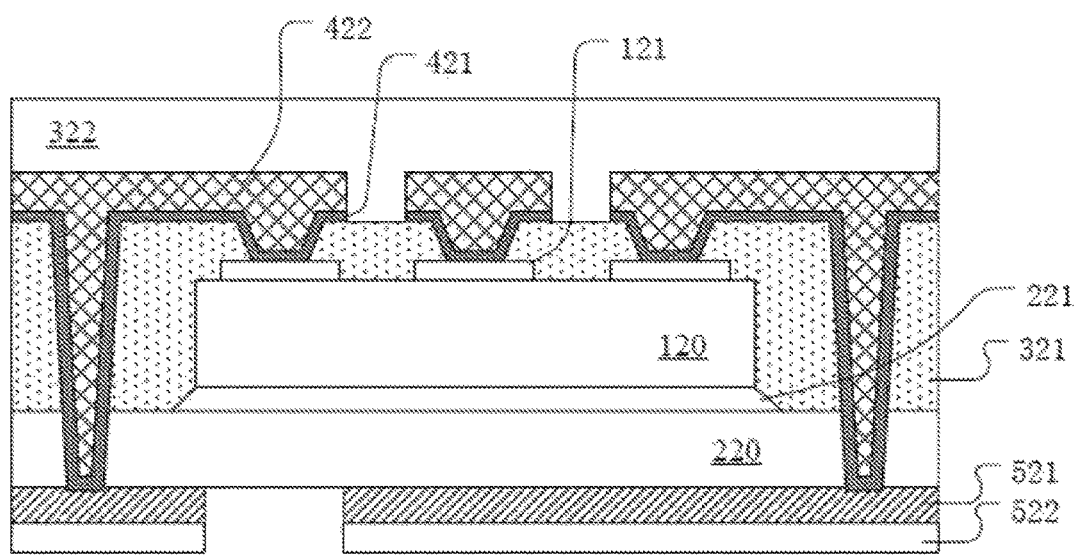

In FIG. 6D, metal layer 421 can be deposited on the surface of encapsulator 321 and in the openings and through holes. Also, the portion of metal layer 421 on the surface of encapsulator 321 may be flattened. In FIG. 6E, metal layer 422 can be formed on metal layer 421 by electroplating process, and flattened by a CMP process. In FIG. 6F, metal layer 422 and metal layer 421 can be patterned to form the interconnection structure. In FIG. 6G, encapsulator 322 may be formed by plastic encapsulation or a prepreg processes, for example. In FIG. 6H, metal layer 521 can be patterned.

Figure 7A:
FIGS. 7A-7K are cross-sectional views of an example method of making the third example package structure, in accordance with embodiments of the present invention.
Figure 7B:
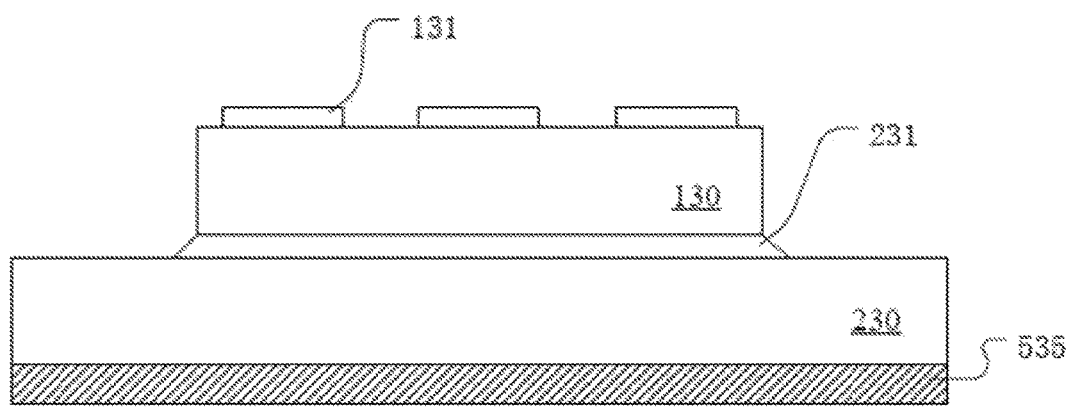

Referring now to FIGS. 7A-7K, shown are cross-sectional views of an example method of making the third example package structure, in accordance with embodiments of the present invention. In FIG. 7A, package substrate 230 can be provided and metal layer 535 may be deposited on the second surface of package substrate 220. In FIG. 7B, die 130 can be bonded to first surface of package substrate 230 through adhesive layer 231. Die 130 can include opposite active and back surfaces. The active surface can be arranged upward, and pads 131 arranged thereon. Adhesive layer 231 may be arranged between the back surface of die 130 and the first surface of package substrate 230.

Figure 7C:
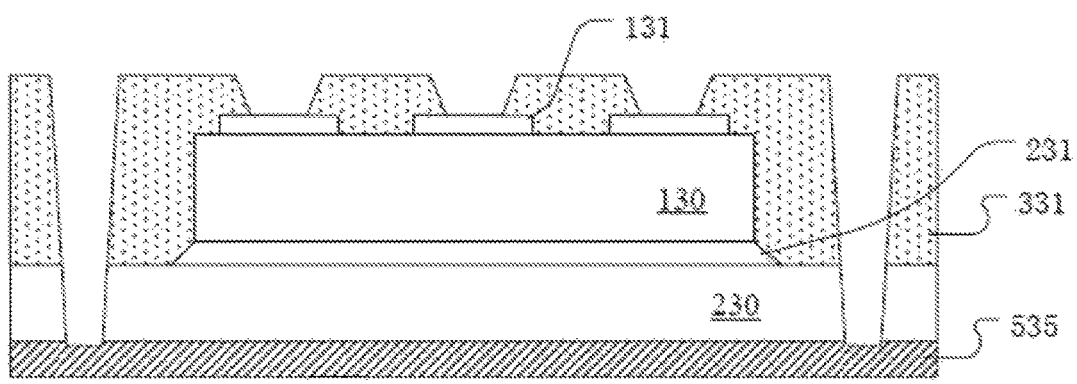

In FIG. 7C, encapsulator 331 can be formed with openings to expose pads 131. Also, through holes may be formed by penetrating encapsulator 331 and package substrate 230 to expose metal layer 535. Encapsulator 331 can encapsulate and protect die 130. For example, encapsulator 331 can be formed by plastic encapsulation or a prepreg process. The openings and through holes can be formed by chemical etching, laser etching, or other suitable processes.

Figure 7D:
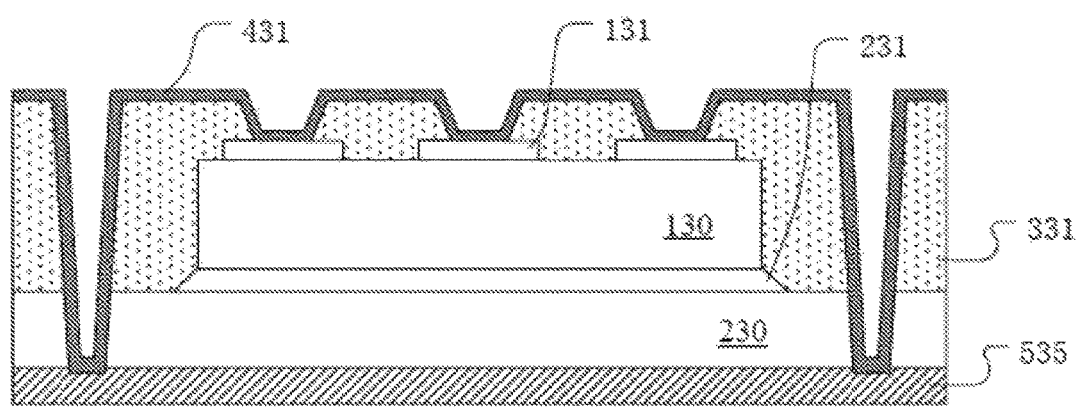
Figure 7E:
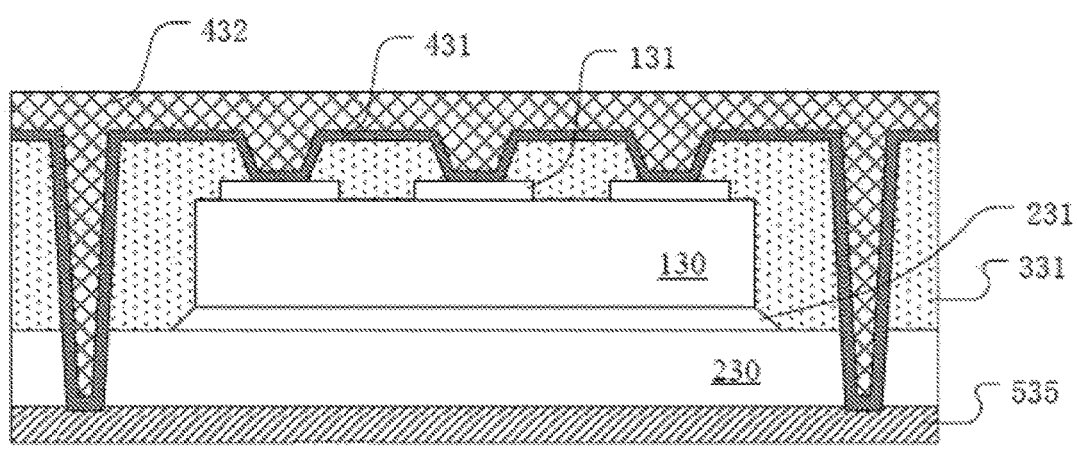
Figure 7F:
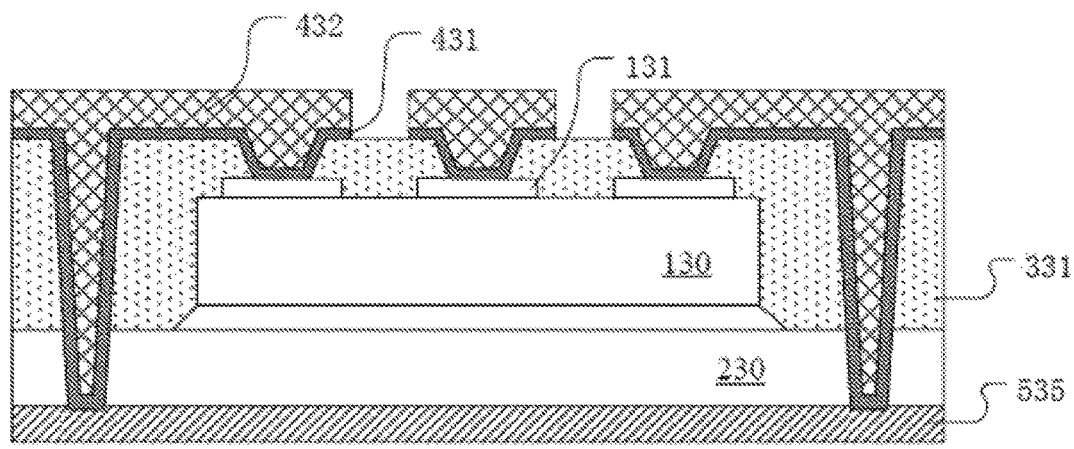

In FIG. 7D, metal layer 431 can be deposited on the surface of encapsulator 331 and in the openings and through holes. The portion of metal layer 431 on the surface of encapsulator 331 can be flattened. In FIG. 7E, metal layer 432 is formed on metal layer 431 by electroplating process, and flattened by a CMP process. In FIG. 7F, metal layers 432 and 431 can be patterned to form the interconnection structure and first channel component of the throughout channel structure.

Figure 7G:
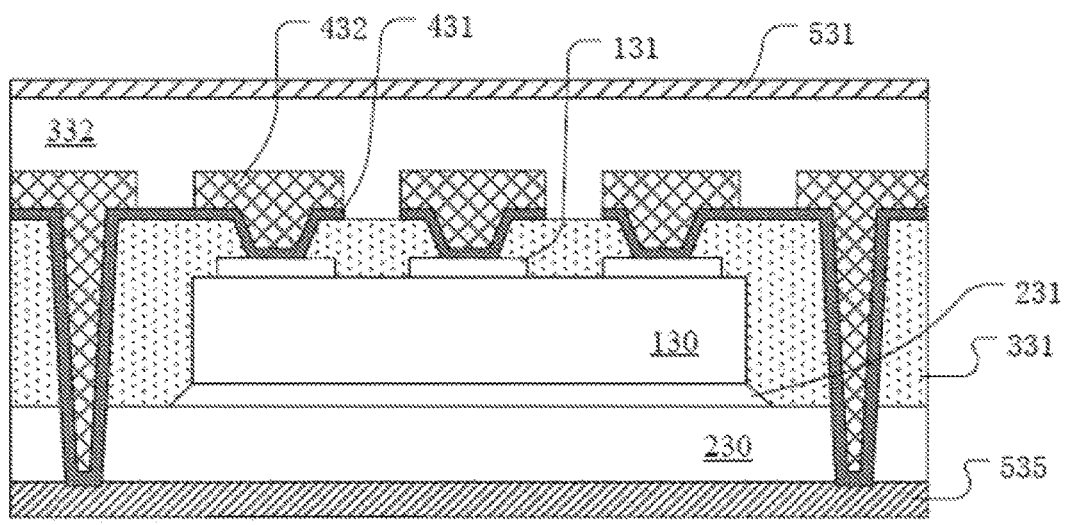
Figure 7H:
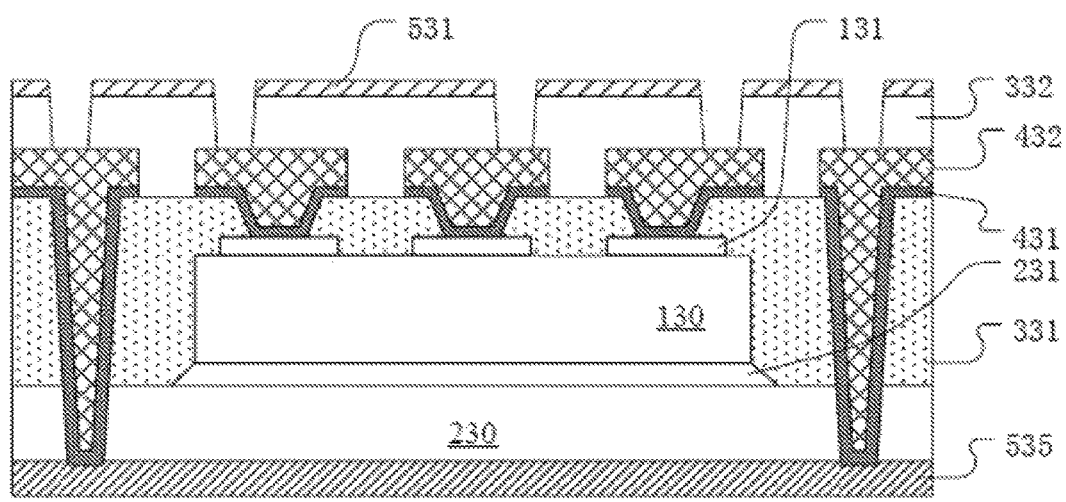
Figure 7I:
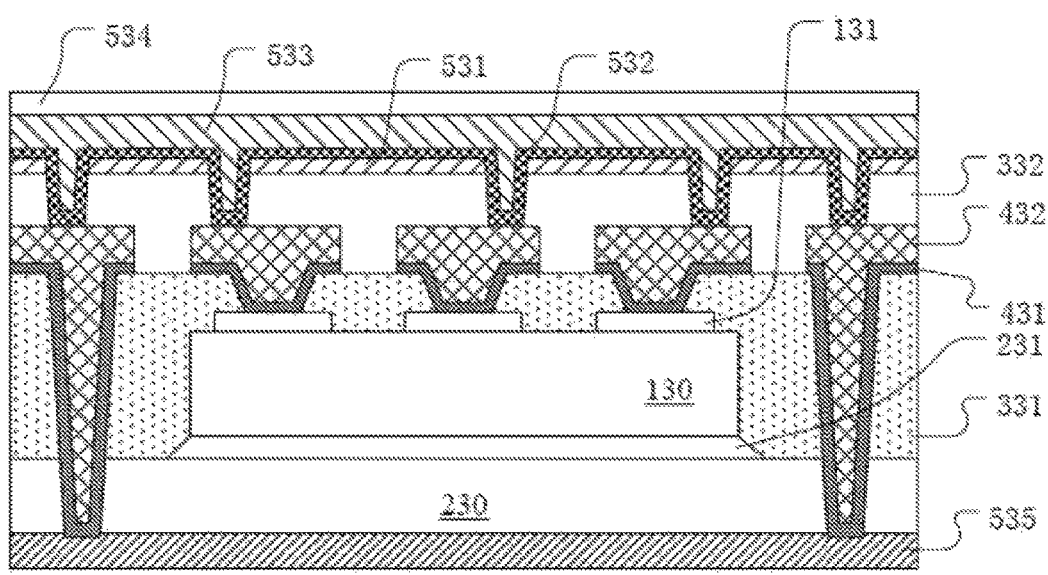
Figure 7J:
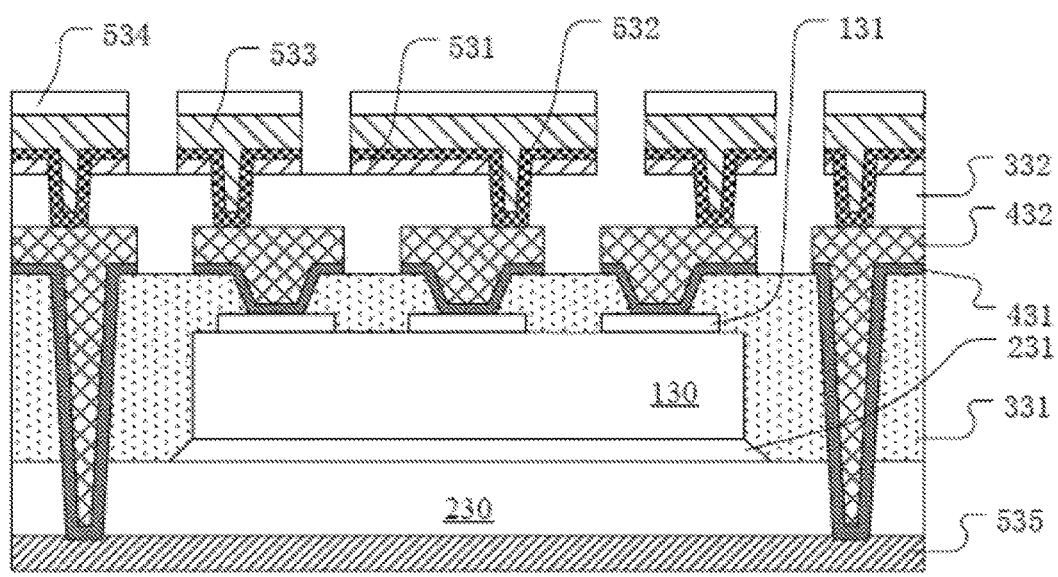
Figure 7K:
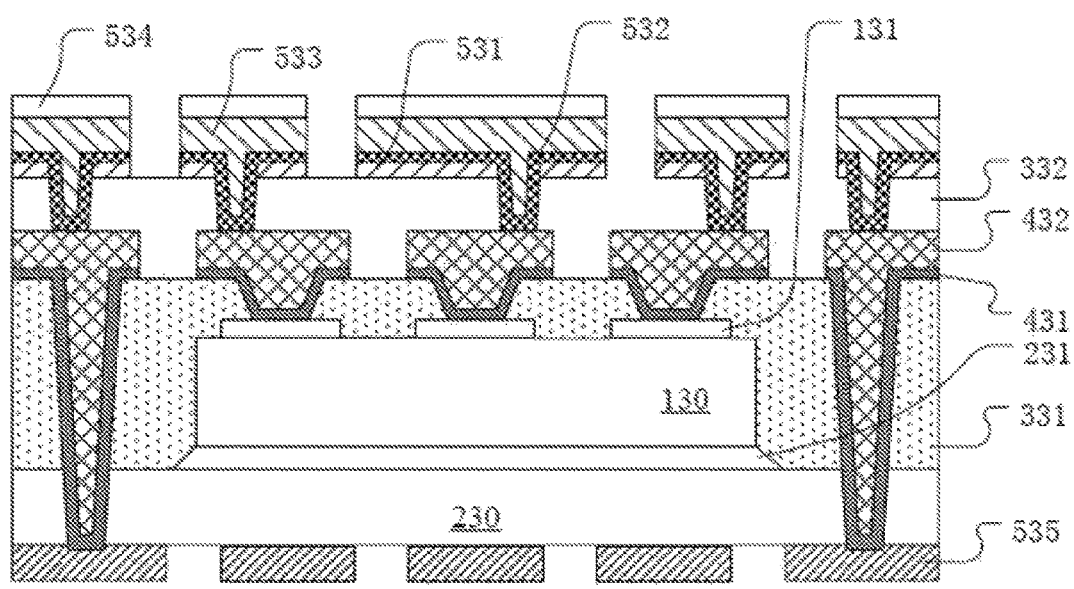

In FIG. 7G, encapsulator 332 can be formed, and metal layer 531 may be deposited thereon. For example, encapsulator 332 can be formed by plastic encapsulation or a prepreg process. In FIG. 7H, openings may be formed in encapsulator 332 and metal layer 531 to expose predetermined regions of the interconnection structure and first channel component. In FIG. 7I, metal layer 532 may be deposited on metal layer 531 and the openings. Metal layer 533 can be formed on metal layer 532 by an electroplating process, and weldable layer 534 may be formed on metal layer 533. In FIG. 7J, metal layers 531, 532, and 533, and weldable layer 534 can be patterned to form the redistribution structure and the second channel component of the through channel structure. In FIG. 7K, metal layer 535 on the back surface of package substrate 230 can be patterned.

Figure 8A:
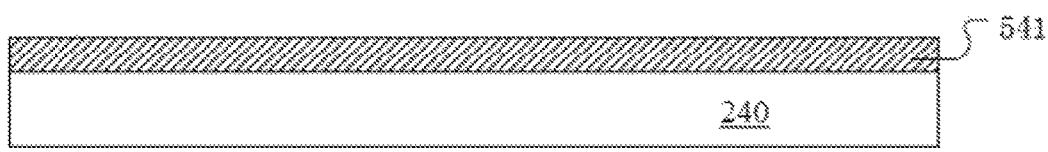
FIGS. 8A-8J are cross-sectional views of an example method of making the fourth example package structure, in accordance with embodiments of the present invention.
Figure 8B:
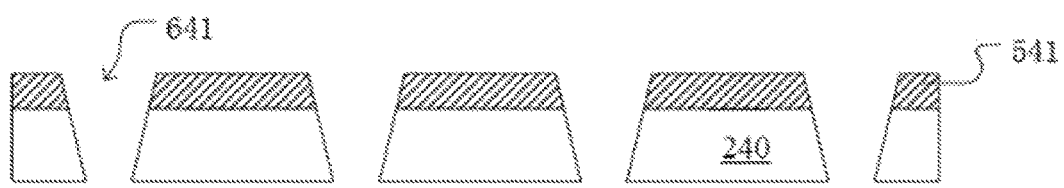

Referring now to FIGS. 8A-8J, shown are cross-sectional views of an example method of making the fourth example package structure, in accordance with embodiments of the present invention. In FIG. 8A, package substrate 240 having opposite first and second surfaces may be provided, and metal layer 541 can be deposited on the first surface of package substrate 240. In FIG. 8B, through holes 641 may be formed by penetrating metal layer 541 and substrate 240.

Figure 8C:
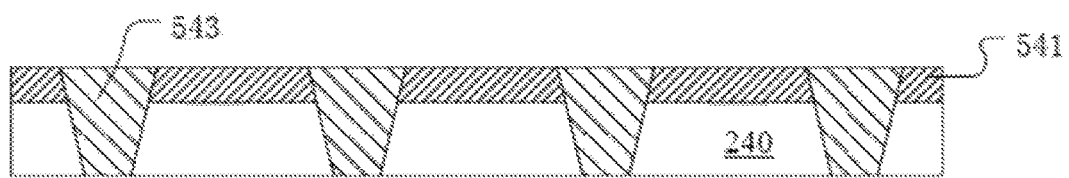
Figure 8D:
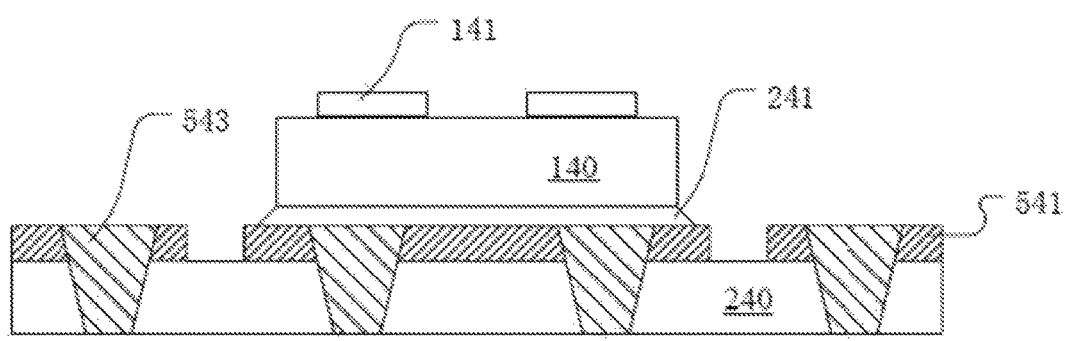

In FIG. 8C, conductive channel components 543 can be formed in through holes 641, such as by a solder paste printing process. In FIG. 8D, metal layer 541 can be patterned to form separate portions. Die 140 can be bonded to at least one portion of metal layer 541 through adhesive layer 241. Die 140 can include opposite active (arranged upward) and back surfaces. Pads 141 can be arranged on the active surface and the back surface. Pads 141 on the back surface can be electrically connected to corresponding conductive channel components 543.

Figure 8E:
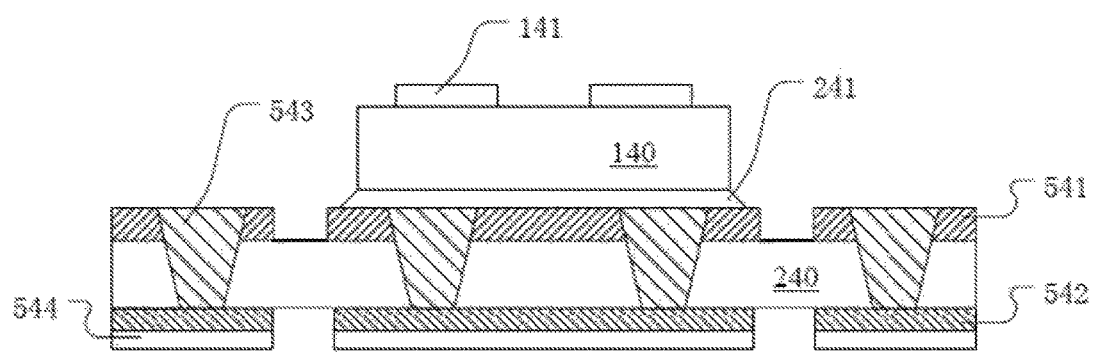
Figure 8F:
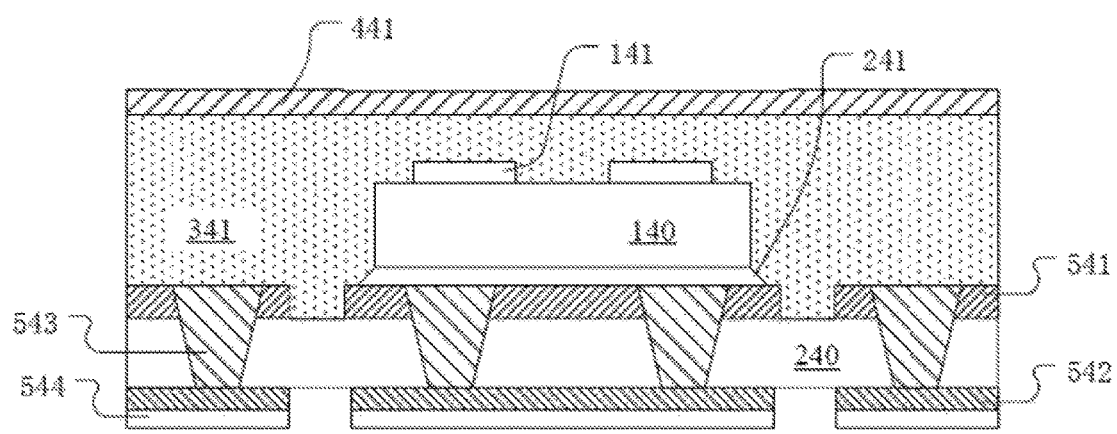
Figure 8G:
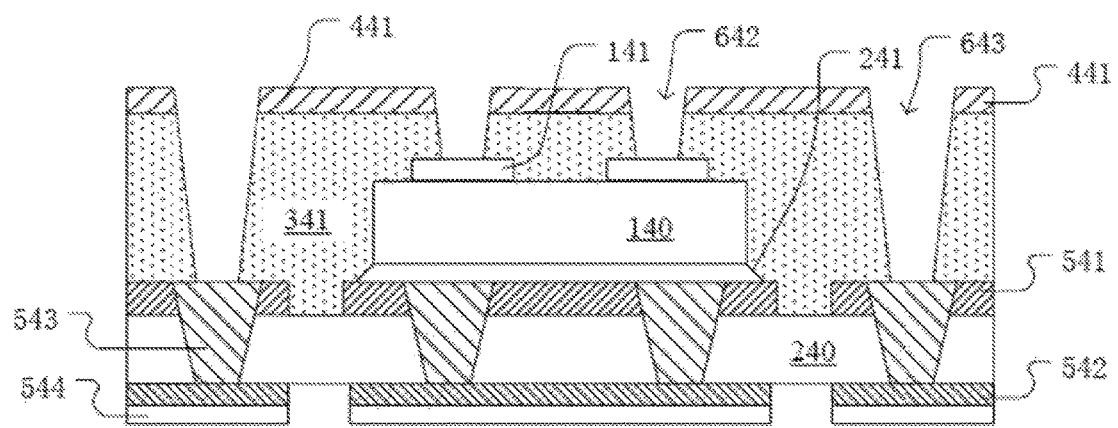

In FIG. 8E, metal layer 542 and weldable layer 544 may be stacked on the second surface of package substrate 240. Metal layer 542 and weldable layer 544 can be patterned to form the redistribution layer. In FIG. 8F, package encapsulator 341 may be formed, and metal layer 441 deposited thereon. For example, package encapsulator 341 can be formed by a plastic encapsulation process or a prepreg process. In FIG. 8G, openings 642 can expose pads 141 on the active surface of die 140. Openings 643 that expose corresponding conductive channel components 543 may be formed by penetrating package encapsulator 341 and metal layer 541.

Figure 8H:
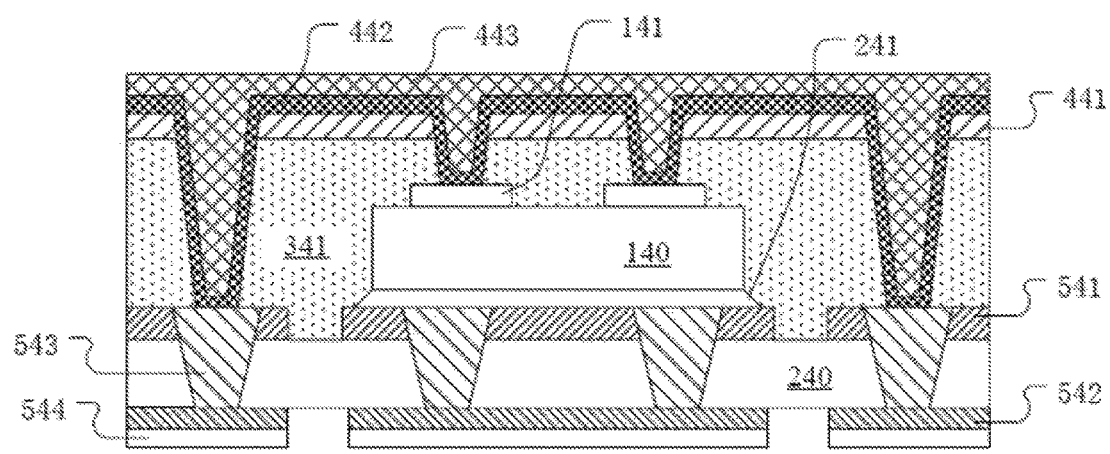
Figure 8I:
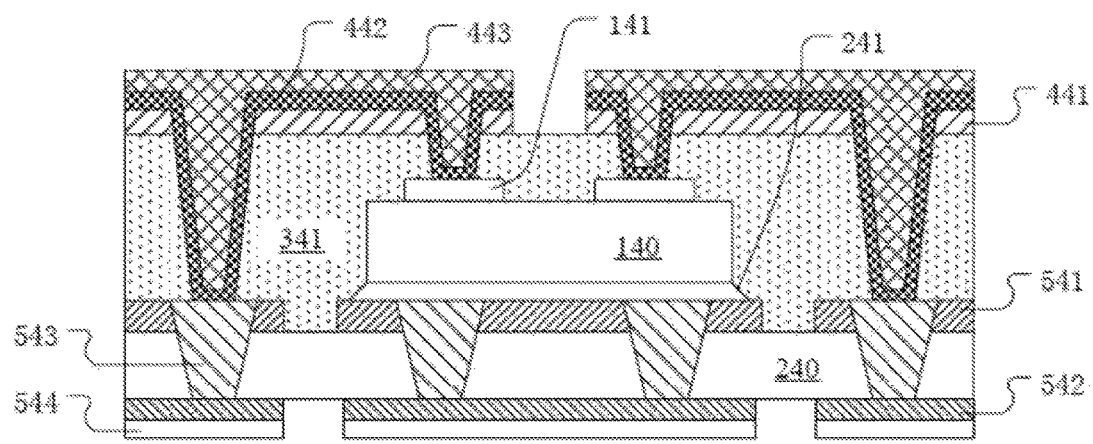
Figure 8J:
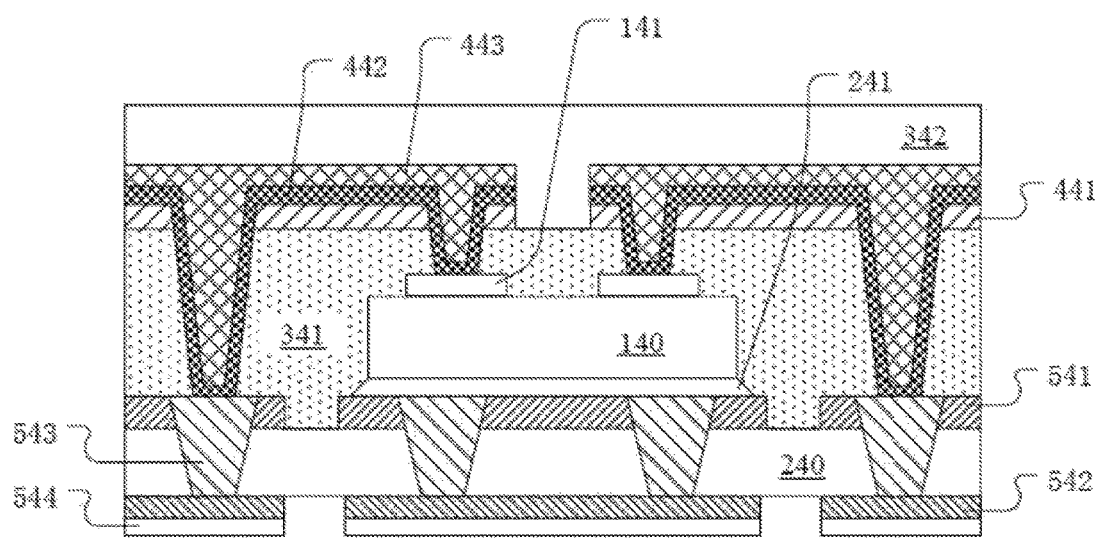

In FIG. 8H, metal layer 442 can be deposited on metal layer 441, openings 642 and 643 that is conformal to package encapsulator 341. Also, metal layer 443 can be formed on metal layer 442 by an electroplating process, for example. In FIG. 8I, metal layers 441, 442, and 443 can be patterned. In FIG. 8J, package encapsulator 342 may be formed.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A package structure, comprising:
    a) a substrate having opposite first and second surfaces;
    b) a die having opposite active and back surfaces, wherein said die is arranged above said first surface of said substrate, said back surface of said die is adjacent to said first surface of said substrate;
    c) pads arranged on said active surface of said die;
    d) a first encapsulator encapsulating said die to expose a portion of said pads;
    e) an interconnection structure arranged on said first encapsulator and said pads, and being electrically connected to said pads;
    f) a second encapsulator encapsulating said interconnection structure to expose a portion of said interconnection structure;
    g) a redistribution structure configured as a patterned conductive metal layer arranged on said second encapsulator and said interconnection structure to form a pin layer on a first surface of said package structure to directly provide external electrical connectivity;
    h) a throughout channel structure extending from said first surface of said package structure to a second surface of said package structure that is opposite to said first surface of said package structure; and
    i) a back patterned metal layer arranged on said second surface of said package structure and connected to said throughout channel structure to form a heat dissipation layer, wherein said back patterned metal layer has only horizontal components and is electrically isolated from said back surface of said die, and wherein said back patterned metal layer is electrically isolated from said pads on said die.

2. The package structure of claim 1, wherein said interconnection structure comprises a first metal layer having a plurality of separate interconnection components, wherein each of said interconnection components comprises a first portion extending along a surface of said first encapsulator, and a second portion extending to said pads in said first encapsulator.

3. The package structure of claim 1, wherein said redistribution structure comprises a patterned second metal layer having a plurality of separate redistribution components.

4. The package structure of claim 3, wherein said plurality of separate redistribution components are arranged on said second surface of said substrate, and wherein each of said redistribution components comprises a first portion extending along a surface of said second encapsulator, and a second portion extending to said interconnection components in said second encapsulator.

5. The package structure of claim 4, wherein at least one of said interconnection components comprises a third portion extending to corresponding redistribution components through said first encapsulator and said substrate.

6. The package structure of claim 4, wherein said at least one of said interconnection components comprises:
   a) a third metal layer having a plurality of separate portions, and being arranged on said second surface of said substrate; and
   b) a plurality of conductive channel components that penetrate said substrate and extend to corresponding redistribution components.

7. The package structure of claim 6, wherein:
   a) said die is coupled to a corresponding redistribution component through at least one of said conductive channel components; and
   b) at least one of said interconnection components comprises a third portion extending to a corresponding conductive channel component through said first encapsulator.

8. The package structure of claim 1, wherein:
   a) said back patterned metal layer is arranged on said second surface of said substrate; and
   b) said throughout channel structure extends from a first surface to a second surface of said package structure.

9. The package structure of claim 1, wherein said back patterned metal layer is a sawtooth structure in a horizontal plane to form said heat dissipation layer.

10. The package structure of claim 1, wherein said throughout channel structure comprises a first channel component having a first portion extending along a surface of said first encapsulator, and a second portion extending to said back patterned metal layer.

11. The package structure of claim 10, wherein said throughout channel structure comprises a second channel component having a first portion extending along a surface of said second encapsulator, and a second portion extending to said interconnection structure in said second encapsulator.

12. The package structure of claim 3, wherein each of said plurality of separate redistribution components comprises a weldable component on a fourth metal component.

13. The package structure of claim 12, wherein said fourth metal component is on a surface of said second encapsulator and openings in said second encapsulator.

14. The package structure of claim 12, wherein each of said plurality of separate redistribution components comprises a seeding metal layer under said fourth metal component.

15. The package structure of claim 12, wherein said weldable component laterally covers said first metal layer.

16. The package structure of claim 12, wherein said weldable component comprises tungsten.

17. The package structure of claim 13, wherein each of said plurality of separate redistribution components comprises a fifth metal component between said fourth metal component and a surface of said second encapsulator, and being arranged to increase a thickness of said redistribution structure.

18. The package structure of claim 12, wherein said weldable component excludes solder balls for said external electrical connectivity.

19. The package structure of claim 1, wherein said redistribution structure comprises first, second, third, and fourth metal layers, wherein:
   a) said second metal layer is arranged on said first metal layer as a seeding layer of said redistribution structure;
   b) said third metal layer is an electroplating layer arranged on said seeding layer;
   c) said fourth metal layer is a solderable layer that fully covers said electroplating layer; and
   d) said first metal layer is configured to increase a thickness of said redistribution structure such that said fourth metal layer forms said pin layer to directly provide external electrical connectivity.

* * * * *